United States Patent [19]
Chen

[11] Patent Number: 5,290,720
[45] Date of Patent: Mar. 1, 1994

[54] TRANSISTOR WITH INVERSE SILICIDE T-GATE STRUCTURE

[75] Inventor: Min-Liang Chen, Allentown, Pa.

[73] Assignee: AT&T Bell Laboratories, Murray Hill, N.J.

[21] Appl. No.: 97,932

[22] Filed: Jul. 26, 1993

Related U.S. Application Data

[63] Continuation of Ser. No. 824,756, Jan. 17, 1992, abandoned, which is a continuation of Ser. No. 624,785, Dec. 7, 1990, abandoned.

[51] Int. Cl.⁵ ............... H01L 21/265; H01L 29/04
[52] U.S. Cl. .................................. 437/41; 437/193; 437/200; 437/233; 437/235; 437/913; 437/984; 257/328; 257/336; 257/377; 257/382; 257/755; 257/773
[58] Field of Search ............ 357/23.4, 67, 59; 437/41, 193, 200, 233, 235, 913, 984; 257/328, 336, 377, 382, 755, 773

[56] References Cited

U.S. PATENT DOCUMENTS 4,868,617 9/1989 Chiao et al. ............... 357/23.14

OTHER PUBLICATIONS

IEDM, "The Impact of Gate-Drain Overlapped LDD (Gold) for Deep Submicron VLSIs," by R. Izawa, et al., pp. 38–41, 1987.

1990 Symposium on VLSI Technology, "A Highly Reliable 0.3 uM N-channel MOSFET Using Poly Spacers," Chen et al., pp. 39–40.

IEDM, "A Self-Aligned Inverse-T Gate Fully Overlapped LDD Device for Sub-Half Micron CMOS," D. S. Wen et al., pp. 765–768, 1989.

*Primary Examiner*—Edward Wojciechowicz
*Attorney, Agent, or Firm*—Richard D. Laumann

[57] ABSTRACT

A method of making a silicided inverse T-gate with an L-shaped silicon spacer and nitride sidewall spacers is described. The L-shaped spacer is electrically connected to the gate.

10 Claims, 1 Drawing Sheet

TRANSISTOR WITH INVERSE SILICIDE T-GATE STRUCTURE

This application is a continuation of application Ser. No. 07/824,756 filed on Jan. 17, 1992, now abandoned, a continuation of Ser. No. 07/624,785 filed Dec. 7, 1990, now abandoned.

TECHNICAL FIELD

This invention relates to field effect transistors having inverse T-gate structures.

BACKGROUND OF THE INVENTION

Essential components of field effect transistors include a gate structure and source and drain regions on opposite sides of the gate structure. As is well known, the voltage applied to the gate structure controls the current flow between the source and drain regions which are doped and formed by, e.g., ion implantation. In metal oxide field effect transistors (MOSFET), the gate is separated from the current channel by a thin oxide layer.

As device dimensions shrank from those used in the early MOSFET devices, effects that were unimportant with the early devices became important and the basic structure described had to be modified to obtain the desired device characteristics. For example, the conventional MOSFET structure has a relatively large electric field near the portion of the gate closest to the source/drain regions. The electric field attracts carriers from the channel and some carriers become trapped in the oxide. Such trapped carriers may lead to, e.g., undesirably large changes in the threshold voltage. As the device dimensions scale down to submicron dimensions, these effects are enhanced. Dividing the source/drain regions into two regions with different dopant concentrations reduces the scope of some of these effects. The region with the lower dopant concentration is nearer the gate structure than is the region with the higher dopant concentration. The structure is called a lightly doped drain and is commonly referred to by the acronym LDD.

The now conventional LDD structure is typically formed with two ion implantation steps; a light, first implant and a heavy, second implant which does not penetrate into the lightly doped regions because of, e.g., oxide sidewalls on the gate structure that are formed after the first implant step. This structure alleviates the effect discussed above with respect to the earlier MOSFET structure which lacked an LDD structure.

However, for channel lengths of approximately 0.6 microns and less, the conventional LDD structure described also begins to exhibit drawbacks. For example, the oxide spacers begin to suffer adverse effects from hot carriers and the S/D resistance, due to the lightly doped region, becomes significant as compared to the channel resistance for channel lengths less than 0.6 μm. Several structures have been proposed to overcome at least some of the drawbacks of the conventional structure by using a gate structure that overlaps at least a portion of the heavily doped source/drain regions, i.e., there is a gate/drain overlap. See, e.g., Izawa et al., *International Electron Devices Meeting*, pp. 38–41, Washington, D.C., 1987. The device described was termed GOLD which is an acronym for gate-drain overlapped LDD. The structure is formed by using an etching process that leaves a portion of the gate polysilicon overlapping the LDD regions. Another approach to achieving gate/drain overlap is described by Chen et al. in 1990 *Symposium on VLSI Technology*, pp. 39–40. This approach used polysilicon sidewalls on the gate structure which overlapped the source/drain regions. The authors stated that the use of conducting sidewalls instead of insulating sidewalls was a straightforward method of obtaining the desired gate/drain overlap, but the Si sidewalls were not connected to the transistor gate. That is, the sidewalls are floating electrically and only capacitively coupled to the gate. The structure does not take full advantage of the gate/drain overlap.

Another approach to gate/drain overlap which has received much attention recently is termed the inverse T-gate. See, for example, the papers by Wen et al., pp. 765–768 and Pfiester et al., pp. 769–772, *International Electron Devices Meeting*, Washington, D.C., 1989. The inverse T-gate structure realizes the gate/drain overlap by using a gate structure having a bottom conducting portion that is wider than the top potion and which overlaps the drain region although it is separated from the drain region by a thin oxide layer. The first paper described two embodiments. The first embodiment is exemplary and will be described briefly here. After the gate oxide is formed, an additional polysilicon layer and another oxide layer are deposited. Polysilicon for the gate is deposited and the gate patterned. These steps are followed by the deposition of another polysilicon layer and a dielectric layer. These layers are etched back to form oxide spacers which have a conductive polysilicon layer between them and the gate oxide layer. The conductive polysilicon overlaps the lightly doped drain. The second paper describes a conceptually similar structure.

None of the methods or structures described are compatible with a self-aligned silicide process, and cannot form a silicide to reduce parasitic resistance without causing a gate to source/drain bridging problem.

SUMMARY OF THE INVENTION

A method of making a semiconductor device having a gate structure and source/drain regions on opposite sides of the gate structure in which the gate structure is an inverse T-gate made by forming the oxide and polysilicon portion of the gate structure on a substrate and sequentially depositing silicon and dielectric layers. An oxide is on the polysilicon surfaces. An etchback then forms L-shaped silicon spacers on the side of the gate structure. Ion implantation is performed to form the source/drain regions. The L-shaped spacers overlap at least portions of the source/drain regions and only a single implantation is required. Dielectric sidewalls are formed which cover the Si spacer. The oxide is removed from the top of the gate structure and from the source/drain regions for contact formation.

In a preferred embodiment, silicidation of the top of the gate structure and the L-shaped spacer, as well as of the source/drain regions, is performed so that the L-shaped spacer is electrically connected to the gate. The dielectric covering the L-shaped spacer prevents bridging between the source/drain region and the gate structure.

A field effect transistor is described which has a substrate and disposed thereon a gate structure, L-shaped silicon spacers on opposed sides of said gate structure, an oxide layer between said L-shaped spacers and said gate structure, dielectric sidewalls over said L-shaped spacers, and source and drain regions on opposed sides of said gate structure. In a preferred embodiment, there is a silicide region electrically connecting said gate structure and said L-shaped silicon spacers.

For reasons of clarity, the elements depicted are not drawn to scale.

DETAILED DESCRIPTION

Figure 1:
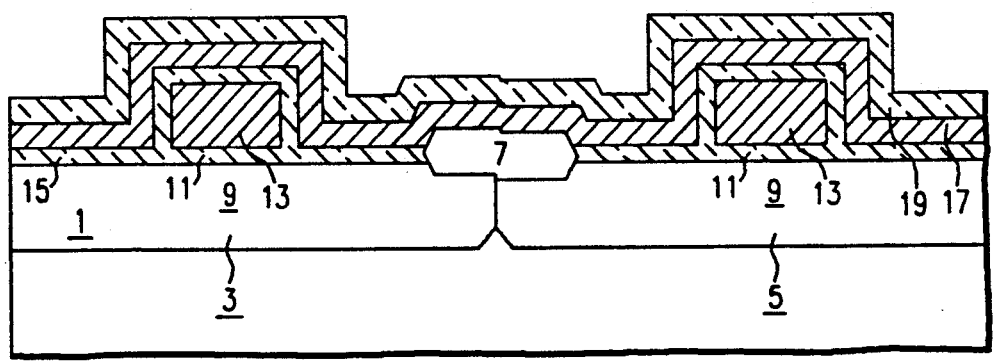
FIGS. 1-4 are sectional views of a portion of an integrated circuit at several stages in the fabrication process according to this invention.

A portion of an CMOS integrated circuit at an intermediate stage of fabrication is depicted in FIG. 1. Depicted are substrate 1, p-type tub 3, n-type tub 5, field oxide 7, gate structure 9 which includes thin oxide layer 11 and polysilicon layer 13, oxide layer 15, silicon layer 17 and dielectric layer 19. The latter layer is typically a sacrificial, i.e., disposable, doped dielectric, i.e., glass.

Several comments about the structure depicted will enable those skilled in the art to fabricate the structure. The n-type and the p-type tubs, as well as the field oxide, are formed using conventional and well known techniques. A thin, thermal oxide is grown and an undoped polysilicon layer is deposited. Standard lithographic techniques are then used to pattern the layers and form this part of the gate structure. A thin oxide layer 15 is grown on the exposed portions of the substrate as well as on the exposed surfaces of the polysilicon. The silicon layer 17 and the disposable doped dielectric are then deposited using techniques that will be readily selected by those skilled in the art. The disposable doped dielectric can be, e.g., BPSG, BPTEOS, etc. These doped dielectrics can be easily removed by an ammonium peroxide and hydrogen peroxide based solution which has a selectivity greater than 50:1 with respect to the thermal oxide. Appropriate proportions will be readily selected.

Figure 2:
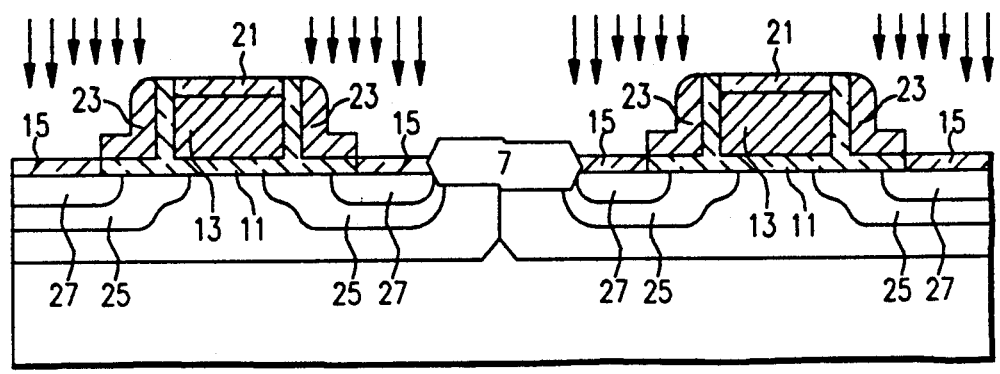

Reactive sputter etching (RSE) is used to form the L-shaped silicon spacer 23 and a wet etch is used to remove the remaining dielectric. To protect the integrity of the field oxide, the wet etch should have a selectivity greater than 50:1 for the sacrificial dielectric with respect to the thermal oxide. The desired n- and p-type dopant concentrations are formed by ion implantation. The ion beams are indicated schematically by the vertical arrows. The implants are also made into the previously undoped polysilicon layers in the gate structure, although these are not shown. The lightly doped regions are shown as regions 25 while the more heavily doped regions are shown as regions 27. Appropriate energies, concentrations, etc., will be readily selected by those skilled in the art. The resulting structure is depicted in FIG. 2. The lightly doped regions are implanted directly through the L-shaped spacer to save two masking steps for the N-L$_{DD}$ and P-L$_{DD}$.

Figure 3:
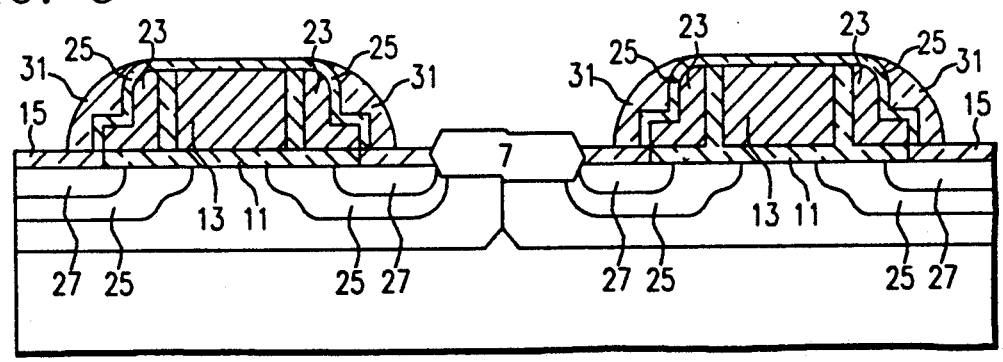

An oxidation step forms oxides 25 on the sidewalls of the L-shaped Si spacer 23 and the S/D regions. A nitride layer is deposited and etched back to form nitride sidewall spacers 31. The oxides 25 act as a buffer between the nitride and Si. Adverse effects are present thereby when nitride is deposited directly on silicon. The source/drain regions are annealed in conventional manner. The resulting structure is depicted in FIG. 3. It should be noted that the nitride spacer extends past the end of the L-shaped silicon spacer in the horizontal direction. The remaining oxide on the gate and the source/drain regions outside the nitride spacer can now be removed so that electrical contacts can be made.

Figure 4:
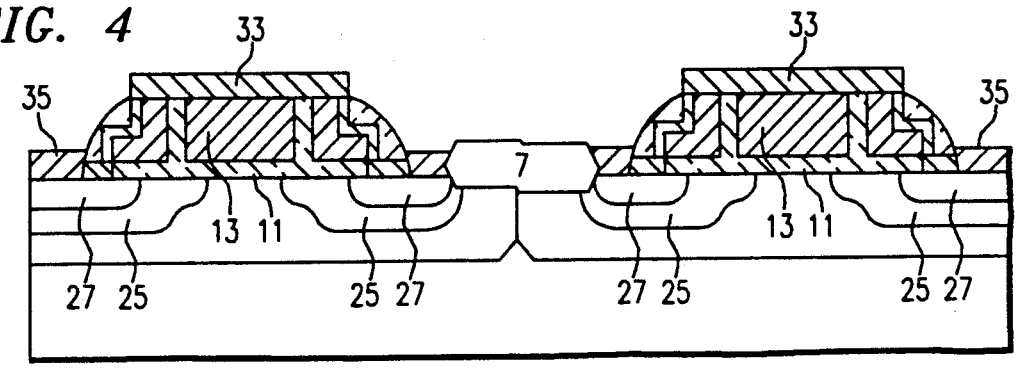

In a preferred embodiment, a silicide forming metal, such as titanium, is now deposited. Conventional techniques are used to form the silicides and then remove the unreacted metal. These steps form silicide regions 33 and 35 on the gate and the source/drain regions, respectively. Times and temperatures will be readily selected by those skilled in the art. The L-shaped Si spacer is thus effectively shunted to the gate by the silicide, i.e., the L-shaped spacer and gate are directly connected electrically by the silicide. The nitride spacer prevents any bridging between the source/drain regions and the gate while the silicide bridges oxide 17 between the gate and the L-shaped spacer. The resulting structure is depicted in FIG. 4.

A device similar to that described was made with a nitride spacer having dimensions comparable to those of the Si spacer. Comparisons were made between the two types of devices with a 0.4 um gate length. The device with the Si spacer was due to a reduction in series resistance. A significant number of hot carriers were trapped outside the gate edge in the nitride device while the trapped charges are under the gate in the Si spacer device thereby reducing the impact on series resistance.

Those skilled in the art will readily know how to finish fabrication of the integrated circuit. For example, a dielectric layer is deposited and patterned to form windows for electrical contacts to the source/drain regions and to the gate. A metal, such as W/TiW, is deposited and etched back, etc. Frequently, two or more levels of metallization are present. Those skilled in the art will be able to complete fabrication without further details.

Variations in the particular embodiment described are contemplated. For example, the integrated circuit does not have to be a CMOS circuit but could be an NMOS or a PMOS or even a BiCMOS integrated circuit. Additionally, the dielectric spacer may be a silicon oxide as well as a silicon nitride. Nitrides are preferred because they have a larger process margin than oxides have for the etch that removes the oxide from the gate and the source/drain regions. Other variations will be readily thought of by those skilled in the art.

I claim:

1. A method of making a semiconductor device comprising the steps of forming a gate structure comprising a thin oxide and polysilicon layer, said thin oxide being between said substrate and said polysilicon and on the surfaces of polysilicon;

forming source/drain regions on opposed sides of said gate structure, said forming being by ion implantation to form lightly and heavily doped regions, said implantation being a single implant through L-shaped silicon spacers and forming said lightly doped regions under said spacers;

said gate structure being an inverse T-gate being made by the further steps of forming said L-shaped silicon spacers on opposed sides of said gate structure by depositing a silicon layer and then a sacrificial layer over said thin oxide and polysilicon layers, and selectively removing said silicon layer and said sacrificial layer to form said L-shaped silicon spacer.

2. A method as recited in claim 1 comprising the further step of removing the thin oxide from the polysilicon on the top of the gate structure and from the source/drain regions.

3. A method as recited in claim 2 comprising the further step of siliciding the top of said gate structure and said source/drain regions, said siliciding step electrically connecting said gate and said L-shaped spacer.

4. A method as recited in claim 3 comprising the further step of forming dielectric sidewall spacers on said L-shaped spacer.

5. A method as recited in claim 4 in which said dielectric comprises silicon nitride.

6. A method of making a semiconductor device comprising the steps of forming a gate structure comprising a thin oxide and polysilicon layer, said thin oxide being between said substrate and said polysilicon and on the surfaces of polysilicon;

said gate structure being an inverse T-gate being made by the steps of forming conductive spacers on opposed sides of said gate structure by depositing a silicon layer and then a sacrificial layer over said thin oxide and polysilicon layers, and selectively removing said silicon layer and said sacrificial layer to form said conductive silicon spacer; and forming source/drain regions on opposed sides of said gate structure, said forming being by ion implantation to form lightly and heavily doped regions, said implantation being a single implant through conductive silicon spacers and forming said lightly doped regions under said spacers.

7. A method as recited in claim 6 comprising the further step of removing the thin oxide from the polysilicon on the top of the gate structure and from the source/drain regions.

8. A method as recited in claim 7 comprising the further step of siliciding the top of said gate structure and said source/drain regions, said siliciding step electrically connecting said gate and said L-shaped spacer.

9. A method as recited in claim 8 comprising the further step of forming dielectric sidewall spacers on said L-shaped spacer.

10. A method as recited in claim 9 in which said dielectric comprises silicon nitride.

* * * * *